United States Patent [19]

Kreuzer

[11] Patent Number: 4,644,262
[45] Date of Patent: Feb. 17, 1987

[54] ELECTRICAL MULTI-POSITION MEASURING DEVICE

[75] Inventor: Manfred Kreuzer, Weiterstadt, Fed. Rep. of Germany

[73] Assignee: Hottinger Baldwin Measurements, Inc., Framingham, Mass.

[21] Appl. No.: 829,850

[22] Filed: Feb. 14, 1986

Related U.S. Application Data

[63] Continuation-in-part of Ser. No. 540,031, Oct. 7, 1983, abandoned.

[30] Foreign Application Priority Data

Oct. 18, 1982 [DE] Fed. Rep. of Germany ....... 3238482

[51] Int. Cl.$^4$ ........................................ G01R 27/02
[52] U.S. Cl. ................................ 324/62; 324/DIG. 1
[58] Field of Search ..................... 324/62, 64, DIG. 1, 324/57 R; 73/760, 774–776; 338/2, 5, 6

[56] References Cited

U.S. PATENT DOCUMENTS

| | | | |
|---|---|---|---|
| 3,048,776 | 8/1962 | Logan | 324/64 |
| 3,443,222 | 5/1969 | Mildwater | 324/64 |
| 3,873,917 | 3/1975 | Kreuzer | 324/DIG. 1 |
| 4,528,499 | 7/1985 | Traub | 324/62 |

FOREIGN PATENT DOCUMENTS

| | | |
|---|---|---|
| 2314754 | 2/1979 | Fed. Rep. of Germany . |
| 437978 | 7/1974 | U.S.S.R. ................................ 324/62 |

*Primary Examiner*—Reinhard J. Eisenzopf
*Assistant Examiner*—Jose M. Solis
*Attorney, Agent, or Firm*—W. G. Fasse; D. H. Kane, Jr.

[57] ABSTRACT

An electrical bridge circuit arrangement for multi-position measuring includes an auxiliary or standard resistance half bridge and measuring resistances ($M_1$, $M_2$, $M_3$) arranged in respective bridge arm circuits. An auxiliary or standard resistance (E) common to all measuring resistances is part of the bridge circuit. The measuring resistances ($M_1$, $M_2$, $M_3$) and the auxiliary resistance (E) can be connected to a supply voltage by means of supply voltage switches ($S_{12}$, $S_{22}$, $S_{32}$; $S_{E3}$). The voltages present at the ends of the supply voltage diagonal of the bridge circuit are tapped by conductors ($L'_{12}$, $L'_{22}$, $L'_{32}$; $L'_{E3}$) and are supplied to the inputs of operational amplifiers (1, 2) which adjust or control the voltage level at the tapping point to a reference level. Voltage drops across the measuring diagonal are tapped by additional conductors ($L_{31}$, $L_{21}$, $L_{11}$; $L_{E1}$) and half of each voltage drop is superimposed on the supply voltage of the measuring arm while the other half is superimposed on the compensating or standard arm of the bridge with respect to the tapping of the compensating half bridge. Therefore, any voltage drops across the measuring diagonal cannot affect the measurement results in spite of long cables to the measuring resistances and in spite of the auxiliary or standard resistance (E) arranged in the measuring bridge circuit arrangement.

4 Claims, 1 Drawing Figure

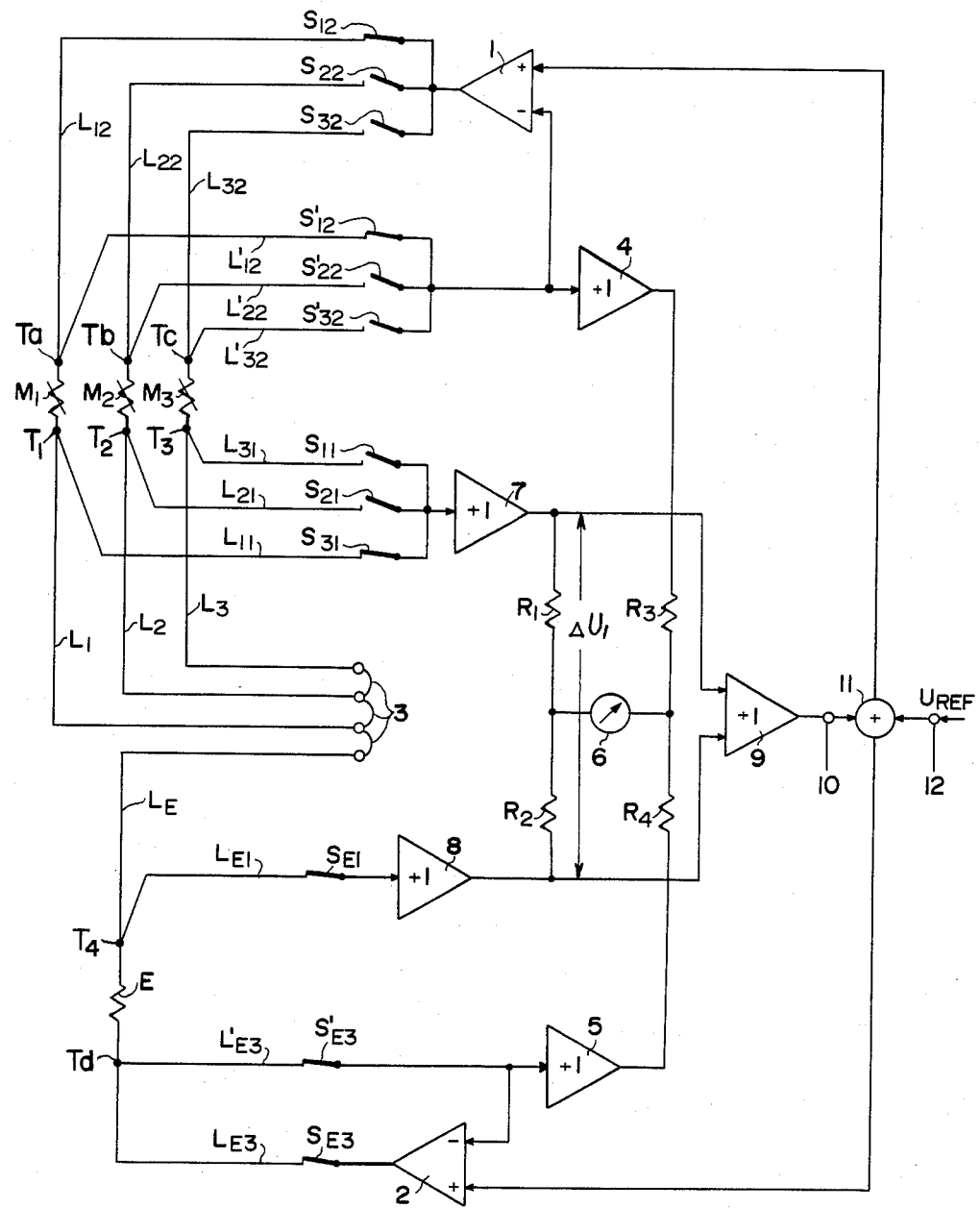

ELECTRICAL MULTI-POSITION MEASURING DEVICE

This application is a continuation-in-part of application Ser. No. 540,031, filed Oct. 7, 1983, now abandoned.

BACKGROUND OF THE INVENTION

The invention relates to an electrical multi-position measuring device forming a bridge circuit including an auxiliary half bridge, wherein the measuring positions or points within a respective arm of the measuring bridge are provided with a measuring resistance arranged in a quarter bridge circuit. An auxiliary resistance also referred to as standard or comparison standard resistance is connected in common to all measuring resistances. In this circuit, the individual measuring points can be selectively connected to a supply voltage source by means of supply voltage switches connected between one end of the respective measuring bridge arm also referred to as quarter bridge and the measuring bridge arm end closest to the auxiliary or standard resistance. A voltage tap is provided at each measuring point between the supply voltage switch and the measuring resistance and between the auxiliary or standard resistance and the supply voltage conductor, or rather, the supply voltage switch for the auxiliary or standard resistance. The voltage tap is connected to a control arrangement that comprises a voltage level control member for comparing the voltage level at the point of the voltage tap with a preselectable reference value. The voltage level control supplies a signal corresponding to the control deviation to a supply voltage generator for readjustment. Such a multi-position measuring device is known from German Patent (DE-PS) No. 2,314,754. Foil strain gages (FSG) may be effectively employed in quarter bridge circuits or bridge arms of the known measuring device whereby effects of voltage drops across the supply voltage conductors and across the switches are eliminated. Thus, contactless switching means may be used as switches in such a measuring device. However, the voltage drops across the measuring diagonal, namely across the conductors between the measuring resistances and the auxiliary or standard resistances still affect the measurement. To keep this effect as small as possible, the measuring resistances and the the auxiliary or standard resistance, for example when foil strain gages are used, must be arranged closely to one another and the connections must be made by very low resistance conductors. If there are greater distances between the individual measuring points, then the individual measuring resistances must be supplemented with standard resistances to form half bridges for avoiding errors caused by voltage drops on the conductors.

OBJECTS OF THE INVENTION

In view of the above it is the aim of the invention to achieve the following objects singly or in combination:

to further develope a multi-position measuring device of the type described above, so that the effect of voltage drops across the conductors of the measuring diagonal, on the measuring result, is eliminated or at least substantially reduced;

to compensate for any error causing voltages across the measuring diagonal of the measuring bridge circuit;

to make sure that the measuring resistors practically do not branch off any current portion from the current flowing to a voltage follower;

to reduce any adverse effects or influences caused by the inherent resistance of the connecting conductors, especially the bridge branching conductors, and of the contact resistances to a negligibly small value;

to eliminate the influence of voltage drops across bridge junctures; and to provide a multi-position measuring bridge circuit which is substantially independent of the length of its supply conductors.

SUMMARY OF THE INVENTION

These objects are realized according to the invention in that an additional voltage tap is provided at each junction between the measuring resistances and the connecting conductors leading from the measuring resistances to the auxiliary or standard resistance, and at the junction between the auxiliary or standard resistance and the connecting conductors leading to the measuring resistances. The tap voltage drop at each measuring resistance connected into the circuit and at the auxiliary or standard resistance is divided so that one half of it is allocated to the measuring bridge arm and the other half is allocated to the auxiliary bridge arm. Further, the bridge supply voltage is increased by this voltage drop.

The error voltages in the measuring diagonals are compensated by this circuit arrangement. It is therefore possible to sequentially supplement the bridge arms formed by several remote individual measuring resistances connected by means of long cables in said bridge arms with an auxiliary or standard resistance on or in the measuring device to form half bridges in the course of a measurement sequence. The voltage drops across the cable resistances do not cause any zeroing or null errors nor do they cause any sensitivity errors.

In a preferred example embodiment the voltages tapped at the measuring resistances and at the auxiliary or standard resistance are each connected through a voltage follower to the inputs of a differential amplifier, the output voltage of which and a reference voltage are respectively applied to the inputs of a signal summing circuit connected to a measuring supply voltage generator.

The unity voltage gain voltage followers have a very high input impedance and a defined, low output impedance. Therefore, practically no current is branched off from the measuring resistances and from the auxiliary or standard resistance to the voltage follower. The effect of the resistance of the branching conductors to the voltage followers, and of the contact junction or transition resistances of the measuring position selector switches arranged in the branch conductors, is therefore reduced to a negligible order of magnitude. A voltage corresponding to the difference between the voltage at the respective measuring resistance and across the auxiliary or standard resistance, is available at the outputs of both voltage followers.

The voltages tapped at the measuring resistances and at the auxiliary or standard resistance are preferably connected to a series connection of two resistances of equal magnitude. The common junction of these two resistances is connected to the input of a measuring device such as a meter. The division or allocation of the voltage drop between the measuring resistances and the auxiliary or standard resistance, one half to the arm of the measuring bridge and the other half to the arm of the auxiliary bridge, eliminates the effect of this voltage drop on the junction of the two resistances which junction is connected to the measuring device.

In an advantageous example embodiment the auxiliary half bridge is connected through a voltage follower to each of the voltages tapped at the measuring resistances and at the auxiliary or standard resistance.

BRIEF FIGURE DESCRIPTION

In order that the invention may be clearly understood, it will now be described, by way of example, with reference to the accompanying drawing, wherein the single FIGURE shows a circuit diagram of the present invention.

DETAILED DESCRIPTION OF PREFERRED EXAMPLE EMBODIMENTS AND OF THE BEST MODE OF THE INVENTION

The drawing shows a circuit diagram of a multi-position measuring device comprising two operation amplifiers 1 and 2 serving as supply voltage generators. Supply voltage switches $S_{12}$, $S_{22}$, $S_{32}$, $S_{E3}$ are connected to the outputs of the amplifiers 1 and 2 and lead to measuring points. The output of the operational amplifier 1 is connected to supply voltage switches $S_{12}$, $S_{22}$, and $S_{32}$ while the supply voltage switch $S_{E3}$ is connected to the output of the operational amplifier 2. One upper terminal of each of a number of measuring resistances $M_1$, $M_2$, and $M_3$ forms first voltage taps Ta, Tb, Tc connected through a respective conductor $L_{12}$, $L_{22}$, and $L_{32}$ to the respective switches $S_{12}$, $S_{22}$, and $S_{32}$. The supply voltage switch $S_{E3}$ is connected by a conductor $L_{E3}$ to an auxiliary or standard resistance E at a second voltage tap Td.

The lower terminal of each of the measuring resistances $M_1$, $M_2$, and $M_3$ provides third voltage taps $T_1$, $T_2$, $T_3$ connected to the respective end of the respective conductors $L_1$, $L_2$, and $L_3$, the other ends of which are connected to each other by bridging conductors 3 which may, for example, be located on the measuring device. Additionally, one end of a conductor $L_E$ is connected to the bridging conductors 3, while the other end of the conductor $L_E$ is connected to the auxiliary or standard resistance E at a fourth voltage tap $T_4$. Thus, any voltage drop across any conductor L1 and LE, or L2 and LE, or L3 and LE is available between the taps $T_1$ and $T_4$, or $T_2$ and $T_4$, or $T_3$ and $T_4$. The measuring resistances $M_1$, $M_2$, and $M_3$ are arranged in a respective bridge arm which forms part of a half bridge during a measurement, by means of the auxiliary or standard resistance E. The auxiliary or standard resistance E is provided in common for all measuring resistances $M_1$, $M_2$, and $M_3$. Conductors $L'_{12}$, $L'_{22}$, and $L'_{32}$ are connected between the supply voltage switches $S_{12}$, $S_{22}$, and $S_{32}$ and the measuring resistances $M_1$, $M_2$, and $M_3$, respectively. These conductors $L'_{12}$, $L'_{22}$, $L'_{32}$ are connected by respective switches $S'_{12}$, $S'_{22}$, and $S'_{32}$ to the inverting input of the operational amplifier 1. The ends of the conductors $L'_{12}$, $L'_{22}$, and $L'_{32}$ are preferably connected to the terminals of the measuring resistances $M_1$, $M_2$, and $M_3$ at the tabs Ta, Tb and Tc. A conductor $L'_{E3}$ is connected between the tab Td between the conductor $L_{E3}$ to the supply voltage switch $S_{E3}$ and the auxiliary or standard resistance E. This conductor $L'_{E3}$ is further connected through a switch $S'_{E3}$ to the inverting input of the operational amplifier 2.

Furthermore, the input of a voltage follower 4 is connected to the inverting input of the operational amplifier 1. This voltage follower 4 has a very high input impedance, a negligibly small output impedance and a voltage gain of one. The output of the voltage follower 4 feeds a resistance $R_3$ that is connected in series with a resistance $R_4$. The end of the resistance $R_4$, that is not connected to resistance $R_3$, is connected to the output of a voltage follower 5 which also has a unity voltage gain, a high input impedance and a negligibly small output impedance. The input of the voltage follower 5 is connected to the inverting input of the operational amplifier 2. The two resistances $R_3$ and $R_4$ form an auxiliary half bridge for the measuring resistors. An input of a measuring device 6 such as a meter is connected to the junction between the two resistances $R_3$ and $R_4$.

Additional voltage taps are provided between the measuring resistances $M_1$, $M_2$, and $M_3$ and additional conductors $L_{11}$, $L_{21}$, and $L_{31}$ leading away from the measuring resistances $M_1$, $M_2$, and $M_3$. The ends of the additional conductors $L_{11}$, $L_{21}$, and $L_{31}$ are connected next to the ends of conductors $L_1$, $L_2$, and $L_3$ and to the terminal ends of the measuring resistances $M_1$, $M_2$, and $M_3$. The other ends of the additional conductors $L_{11}$, $L_{21}$, and $L_{31}$ are connected to respective switches $S_{11}$, $S_{21}$, and $S_{31}$, and other terminals of which are commonly connected to the input of a voltage follower 7 having a very high input impedance, a low output impedance, and a voltage gain of one. A conductor $L_{E1}$ is connected together with the conductor $L_E$ to the terminal of the auxiliary or standard resistance E. The conductor $L_{E1}$ is connected through a switch $S_{E1}$ to the input of another voltage follower 8 also having a very high input impedance, a low output impedance, and a voltage gain of one. The outputs of the voltage followers 7 and 8 are connected to the respective terminals of identical resistances $R_1$ and $R_2$ connected in series. The other input of the measuring device 6 is connected to a common junction between the two resistances $R_1$ and $R_2$. Furthermore, the outputs of the voltage followers 7 and 8 each feed into a respective input of a differential amplifier 9, the output of which is connected to an input 10 of a signal summing circuit 11. The second input 12 of the signal summing circuit 11 is connected to a fixed, given reference voltage $U_{Ref}$, whereby the signal summing circuit compares the output voltage from the differential amplifier 9 with the reference voltage $U_{Ref}$ and functions as a voltage level control.

In operation, the voltage supplied by the differential amplifier 9 is superimposed on the reference $U_{Ref}$ in the signal summing circuit 11. Two voltages of equal magnitude, either positively or negatively and symmetrically balanced to ground due to the identical resistors $R_1$ and $R_2$ are formed by this summed voltage so that each one corresponds to one half of the summed voltage. The positive and the negative voltages are supplied to the respective non-inverting inputs of the operational amplifiers 1 and 2. In this way, the voltage drops between the outputs of the operational amplifiers 1 and 2 and the inputs of the measuring resistances $M_1$, $M_2$, and $M_3$ as well as the input of the auxiliary or standard resistance E, are balanced or equalized.

The voltage drop within the measuring diagonal of the bridge circuit across the conductor $L_E$ and the respective conductor $L_1$, $L_2$, or $L_3$ that is switched into the bridge circuit by the actuation of the corresponding switch $S_{12}$, $S_{22}$, or $S_{32}$, is tapped by means of the conductor $L_{E1}$ and the respective conductor $L_{11}$, $L_{21}$, or $L_{31}$ selected by the actuation of the switches $S_{11}$, $S_{21}$, $S_{31}$. Practically no voltage drops arise across the conductors $L_{E1}$, $L_{11}$, $L_{21}$, $L_{31}$, or across the switches $S_{E1}$, $S_{11}$, $S_{21}$, and $S_{31}$, because of the high input impedances of the voltage followers 7 and 8 forming voltage measuring means for measuring the voltage drop between $T_1$ and $T_4$ or $T_2$ and $T_4$ or $T_3$ and $T_4$.

The potential at the output of that measuring resistance that is connected to the supply voltage and the potential at the standard or auxiliary resistance E both reach the series circuit of the two resistances $R_1$ and $R_2$ and the differential amplifier 9 by means of the voltages followers 7 and 8. Accordingly, a differential voltage $\Delta U_1$ is present at the resistances $R_1$ and $R_2$ and at the inputs of the differential amplifier 9. The differential amplifier 9 has a unity voltage gain and produces a voltage $U_1$, relative to ground, from the differential voltage $\Delta U_1$, and supplies this voltage $U_1$ to the signal summing circuit 11. The signal summing circuit adds the voltage $U_1$ to the reference voltage $U_{Ref}$. The summation of both voltages forms the operating voltage $U_B$ to which the following equation applies: $U_B = U_{Ref} + U_1$. The operating voltage $U_B$ is divided into positive and negative halves, whereby the two halves are symmetrical to ground or rather to ground potential due to the identical resistors $R_1$ and $R_2$. The two operational voltage halves $+U_B/2$ and $-U_B/2$ are supplied to the respective non-inverting inputs of the operational amplifiers 1 and 2.

Additional voltage differentials or drops labelled $\Delta U_2$ and $\Delta U_3$ are present between each of the outputs of the operational amplifiers 1 and 2 and their respective inverting inputs. These voltage drops are generated by the currents flowing through the conductors $L_{12}$, $L_{22}$, $L_{32}$, and $L_{E3}$ and the switches $S_{12}$, $S_{22}$, $S_{32}$, and $S_{E3}$.

The operational amplifiers 1 and 2 control or adjust the voltages arising at the inputs of the measuring resistances $M_1$, $M_2$, and $M_3$ and the auxiliary or standard resistance E to values respectively corresponding to the operational voltages $+U_B/2$ and $-U_B/2$. The operational voltage $U_B$ is larger than the reference voltage $U_{Ref}$ by the differential voltage $\Delta U_1$. Therefore, a voltage drop exactly equal to $U_{Ref}$ occurs across that measuring resistances $M_1$, $M_2$ or $M_3$ that is switched into the measuring circuit when the standard or auxiliary resistance E is connected, because a voltage drop equal to the voltage $\Delta U_1$ occurs across the conductors $L_E$ and $L_1 \ldots L_3$. Therefore, the voltage drops $\Delta U_1$, $\Delta U_2$, and $\Delta U_3$ do not have any effect on the measuring sensitivity.

The differential voltage $\Delta U_1$ is exactly halved by the two identical resistances $R_1$ and $R_2$. Therefore, two partial or component voltages of identical magnitude are symmetrically fed to the arms of the bridges. Consequently, the differential voltage has no effect on the zero or null position of the measuring device 6 in other words zero drift is avoided.

The auxiliary or standard resistance E can be located on or in the measuring device. This measuring device preferably comprises the elements $S_{12}$, $S_{22}$, $S_{32}$, $S'_{12}$, $S'_{22}$, $S'_{32}$, $S_{11}$, $S_{21}$, $S_{31}$, $S_{E1}$, $S_{E3}$, $S'_{E3}$, 1, 2, 4, 5, 6, 7, 8, 9, 11, $R_1$, $R_2$, $R_3$, and $R_4$, and also the operating voltage supply necessary for the amplifiers 1 and 2, and for the voltage followers 1, 2, 5, 7, and 8, 9, 11.

The measuring resistances $M_1$, $M_2$, and $M_3$ may be located at a substantial distance from the measuring device and may be connected to the measuring device by long cables. In spite of this, the voltage drops across these cables do not cause any zeroing or sensitivity errors in the measuring device 6, because the described compensation keeps the sensitivity of the bridge circuit constant.

The supply voltage switches $S_{12}$ and $S_{E3}$ as well as the switches $S'_{12}$, $S_{31}$, $S'_{E3}$, and $S_{E1}$ are shown in the closed portion, while the other switches are shown open in the drawing. In the shown position of the switches, the measuring resistance $M_1$ is selected for a measurement.

Although the invention has been described with reference to specific example embodiments it will be appreciated that it is intended to cover all modifications and equivalents within the scope of the appended claims.

Incidentally, the switches $S_{12}$, $S'_{12}$, $S_{31}$ etc. are operable in synchronism, for example, manually by using switches having ganged multiple contacts.

What is claimed is:

1. An electrical bridge circuit arrangement for multiposition measuring, comprising supply voltage means (1, 2), measuring bridge branches, and an auxiliary half bridge ($R_3$, $R_4$), individual measuring means in a respective measuring bridge branch of said measuring bridge branches, said individual measuring means including measuring resistances ($M_1$; $M_2$; $M_3$) each arranged in a respective measuring bridge branch, and a standard resistance (E) arranged in common to all measuring substances, first switching means ($S_{12}, \ldots S_{E3}$) for selectively connecting said individual measuring resistances to said supply voltage means (1, 2), a first voltage tap (Ta, Tb, Tc) provided between measuring resistance and said supply voltage means, first switching means ($S_{12}, \ldots$) between the respective measuring resistance ($M_1$; $M_2$; $M_3$) and said voltage supply means, a second voltage tap (Td) between said standard resistance (E) and a respective supply voltage conductor ($L_{E3}$), closed loop control means operatively connected to said first and second voltage taps (Ta, Tb, Tc, and Td), said closed loop control means comprising a voltage summing circuit (9, 11), reference voltage supply means (12) connected to one input of said voltage summing circuit for supplying a reference voltage value ($U_{Ref}$) to said one input of said voltage summing circuit, said voltage summing circuit providing a voltage sum to said supply voltage means (1, 2) for readjustment of said supply voltage means (1, 2), said bridge circuit arrangement further comprising third voltage taps ($T_1$, $T_2$, $T_3$) between said measuring resistances ($M_1$, $M_2$, and $M_3$) and respective conductors ($L_1$, $L_2$, and $L_3$) connecting said measuring resistances ($M_1$, $M_2$, $M_3$) to said standard resistance (E), and a fourth voltage tap ($T_4$) between said standard resistance (E) and a connecting conductor ($L_E$) connecting said measuring resistances ($M_1$, $M_2$, $M_3$) to said standard resistance (E), voltage follower means (7, 8) connected to said third and fourth voltage taps ($T_1$, $T_2$, $T_3$, and $T_4$) for measuring a voltage drop ($\Delta U_1$) appearing across outputs of said follower means, means connecting said voltage drop ($\Delta U_1$) to other input means of said voltage summing circuit (9, 11), whereby one half of said voltage drop ($\Delta U_1$) is supplied to the respective measuring bridge branch of the bridge circuit arrangement and the other half of said voltage drop ($\Delta U_1$) is supplied to the standard resistance in said auxiliary half bridge branch, said voltage summing circuit (9, 11) being connected between said voltage follower means (7, 8) and said reference voltage supply means for increasing the bridge supply voltage by said voltage drop ($\Delta U_1$).

2. The electrical bridge circuit arrangement of claim 1, comprising second switching means ($S_{11}$, $S_{21}$, $S_{31}$, and $S_{E1}$) respectively arranged in series with conductors ($L_{31}$, $L_{21}$, $L_{11}$, and $L_{E1}$) connected for supplying said voltage drop ($\Delta U_1$) to said voltage follower means (7, 8); said second switching means being actuatable synchronously with respective ones of said first switching means ($S_{12}$, $S_{22}$, $S_{32}$; $S_{E3}$) connected to the respective measuring resistances ($M_1$, $M_2$, $M_3$) and to the standard resistance (E) respectively; and third switching means ($S'_{12}$, $S'_{22}$, $S'_{32}$; and $S'_{E3}$) arranged in series with conductors ($L'_{12}$; $L'_{22}$, $L'_{32}$; and $L'_{E3}$) connected to voltages tapped at the input terminals of the measuring resistances ($M_1$, $M_2$, $M_3$) and at said standard resistance (E), said third switching means being operable synchronously with respective ones of said first switching means and with respective ones of said second switching means.

3. The electrical bridge circuit arrangement of claim 1, wherein said closed loop control means comprise two resistors ($R_1$ and $R_2$) having identical resistance values connected in series with each other, and a measuring device (6), and wherein said voltage drop ($\Delta U_1$) is supplied to said series connected resistors ($R_1$, $R_2$) having a junction connected to an input of said measuring device (6).

4. The electrical bridge circuit arrangement of claim 1, further comprising two voltage follower means (4, 5), said auxiliary half bridge comprising two series connected resistors (3, 4) connected through said voltage follower means (4, 5) to each of the voltages tapped at inputs of said measuring resistances ($M_1$, $M_2$, and $M_3$) and at an input of said standard resistance (E).

* * * * *